United States Patent
Kumagai

(10) Patent No.: US 10,451,665 B2
(45) Date of Patent: Oct. 22, 2019

(54) PULSE CURRENT APPLICATION CIRCUIT AND CONTROL METHOD THEREOF

(71) Applicant: FUJI ELECTRIC CO., LTD., Kawasaki-shi, Kanagawa (JP)

(72) Inventor: Naoki Kumagai, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/968,186

(22) Filed: May 1, 2018

(65) Prior Publication Data

US 2018/0340972 A1    Nov. 29, 2018

(30) Foreign Application Priority Data

May 26, 2017   (JP) ................................. 2017-104256
Feb. 26, 2018   (JP) ................................. 2018-032014

(51) Int. Cl.
| | |
|---|---|
| *H03B 1/00* | (2006.01) |
| *G01R 31/26* | (2014.01) |
| *H03K 17/0814* | (2006.01) |
| *H03K 17/14* | (2006.01) |
| *H03K 17/74* | (2006.01) |

(52) U.S. Cl.
CPC ... *G01R 31/2632* (2013.01); *H03K 17/08142* (2013.01); *H03K 17/145* (2013.01); *H03K 17/74* (2013.01)

(58) Field of Classification Search
CPC ........ H01L 2924/00; H01L 2924/0002; H02M 3/158; H02M 3/156
See application file for complete search history.

(56) References Cited

U.S. PATENT DOCUMENTS

| | | | |
|---|---|---|---|
| 6,031,855 A | 2/2000 | Watanabe | |
| 2004/0150433 A1* | 8/2004 | Hourai | H03K 17/08142 |
| | | | 327/110 |

FOREIGN PATENT DOCUMENTS

| | | |
|---|---|---|
| EP | 0798828 A2 | 10/1997 |
| JP | H05-095148 A | 4/1993 |
| JP | H06-244484 A | 9/1994 |
| JP | H07-038184 A | 2/1995 |
| JP | H09-270555 A | 10/1997 |

\* cited by examiner

*Primary Examiner* — Sibin Chen
(74) *Attorney, Agent, or Firm* — Rabin & Berdo, P.C.

(57) ABSTRACT

A pulse current application circuit for applying a pulse current to a current application target. The pulse current application circuit includes a first switching element and an inductive load connected in series between a power supply and a reference potential, a second switching element connected in series with the current application target, the second switching element and the current application target being connected between the reference potential and a connection point of the first switching element and the inductive load, and a commutation circuit connected in parallel to the inductive load, the commutation circuit having a current flowing therethrough and having no current flowing therethrough respectively when the second switching element is in a cut-off state and a conductive state.

8 Claims, 9 Drawing Sheets

PULSE CURRENT APPLICATION CIRCUIT AND CONTROL METHOD THEREOF

CROSS-REFERENCE TO RELATED APPLICATIONS

This application is based upon and claims the benefits of priority of the prior Japanese Patent Application No. 2017-104256, filed on May 26, 2017, and the Japanese Patent Application No. 2018-032014, filed on Feb. 26, 2018, the entire contents of which are incorporated herein by reference.

BACKGROUND OF THE INVENTION

1. Field of the Invention

The embodiments discussed herein relate to a pulse current application circuit that applies a large current having a short pulse to a device to be measured, which will be hereinafter referred to as a device under test (DUT), and relate to a control method of this pulse current application circuit.

2. Background of the Related Art

For example, when a surge current is applied to a semiconductor element for a short time, characteristics of the semiconductor element could be deteriorated. Thus, to check the reliability of semiconductor elements, a circuit that applies a large pulse current is needed. In addition, there are cases in which the presence of crystal defects that grow when a pulse current is repeatedly applied to a semiconductor element is checked by applying a large pulse current within a time much shorter than a time in which the crystal defects grow. In such cases, the results acquired by the checking on semiconductor elements are used for screening of the semiconductor elements. In these cases, too, a pulse current application circuit that applies a large pulse current is needed. It is desirable that the pulse current applied by the above pulse current application circuits have, for example, a pulse width of about 200 nanoseconds (ns), which is shorter than a pulse width of a few microseconds (μs) with which an insulated gate bipolar transistor (IGBT) is able to perform switching. In addition, it is desirable that the pulse current have a large current value no less than a few dozen amperes (A).

As a pulse current application circuit that applies this large pulse current to a semiconductor element, there is known a semiconductor switching element that is connected in series with a DUT between a power supply and a ground terminal and that is controlled to be turned on (conductive) or turned off (cut off) (for example, see Japanese Laid-open Patent Publication No. 5-95148). In the pulse current application circuit discussed in Japanese Laid-open Patent Publication No 5-95148, bipolar transistors are used as switches. In contrast, in recent pulse current application circuits expected to achieve a high switching speed, metal-oxide-semiconductor field-effect transistors (MOSFETs), which will hereinafter be referred to as MOS transistors, are used.

FIG. 8 is a circuit diagram illustrating an example of a conventional pulse current application circuit using a MOS transistor. FIG. 9 illustrates load curves of operations of the conventional pulse current application circuit. In FIG. 9, the horizontal axis represents a power supply voltage, and the vertical axis represents a current flowing through a DUT and a resistor.

As illustrated in FIG. 8, the conventional pulse current application circuit includes a MOS transistor 101 having a gate terminal connected to a gate drive circuit 102. The MOS transistor 101 has a source terminal connected to a ground terminal and has a drain terminal connected to the cathode terminal of a diode 103 used as a DUT. The diode 103 has an anode terminal connected to one terminal of a current-limiting resistor 104, and the other terminal of the current-limiting resistor 104 is connected to a power supply Vdc.

The MOS transistor 101 is turned on or off by a gate drive signal G supplied from the gate drive circuit 102. When the MOS transistor 101 is off, a current Idut, which is determined by the voltage of the power supply Vdc and the resistance value of the current-limiting resistor 104, does not flow through the diode 103. In contrast, when the MOS transistor 101 is on, the current Idut flows through the diode 103. For ease of explanation, the following description ignores characteristics of the diode 103.

For example, when the MOS transistor 101 is in a low temperature state at approximately 25° C., the MOS transistor 101 exhibits output characteristics as illustrated by a reference character 101a in FIG. 9. In this state, if the power supply Vdc has a voltage Vdc1 and the current-limiting resistor 104 has current-voltage characteristics as illustrated by a reference character 104a, the intersection of the output characteristics 101a of the MOS transistor 101 and the current-voltage characteristics 104a of the current-limiting resistor 104 represents a current Ia (=Idut) that flows through the diode 103.

Since the loss of the MOS transistor 101 is expressed by a product of the on-resistance of the MOS transistor 101 and the square of the current, if a large pulse current is caused to flow through the diode 103, the temperature of the MOS transistor 101 rises. Generally, when the temperature rises, the electron mobility of the MOS transistor 101 decreases. Consequently, since the on-resistance is increased, a smaller current flows. For example, when in a high temperature state at approximately 150° C., the MOS transistor 101 exhibits output characteristics as illustrated by a reference character 101b. Namely, while the large current Ia flows through the MOS transistor 101 when the application of a pulse current is started, when the temperature of the MOS transistor 101 rises after the pulse current is applied for a long time, the current Ia drops to a current Ib1. In other words, the current flowing through the MOS transistor 101 fluctuates depending on the temperature. In this case, since the current applied to the diode 103 significantly fluctuates depending on the temperature of the MOS transistor 101, the MOS transistor 101 is unable to apply a stable current to the diode 103.

In contrast, by raising the power supply Vdc to a voltage Vdc2 and by increasing the resistance value of the current-limiting resistor 104, it is possible to bring the intersection of the output characteristics 101a of the MOS transistor 101 and the current-voltage characteristics 104b of the current-limiting resistor 104 to the current Ia. In this case, the intersection of the output characteristics 101b of the MOS transistor 101 in a high temperature state and the current-voltage characteristics 104b of the current-limiting resistor 104 represents a current Ib2. Thus, when the current-limiting resistor 104 has the current-voltage characteristics 104a with a small resistance value, the difference between the currents that flow depending on the temperature of the MOS transistor 101 is ΔI1. In contrast, when the current-limiting resistor 104 has the current-voltage characteristics 104b with a large resistance value, the difference between the currents that flow depending on the temperature of the MOS transistor 101 is ΔI2 (<ΔI1). It is seen that the current applied to the diode 103 has smaller dependence on the temperature characteristics of the MOS transistor 101.

While the diode 103 used as a DUT is disposed between the drain terminal of the MOS transistor 101 and the current-limiting resistor 104 in the pulse current application circuit in FIG. 8, the diode 103 may be disposed between the source terminal of the MOS transistor 101 and the ground terminal. In this case, by connecting a reference potential of the gate drive circuit 102 to the source terminal of the MOS transistor 101, basically the same operation and temperature dependence as those when the diode 103 is connected to the drain terminal of the MOS transistor 101 are achieved.

However, if the resistance value of the current-limiting resistor is increased and the voltage of the power supply is raised to reduce the difference between the currents that flow depending on the temperature of the MOS transistor, since the voltage applied to the current-limiting resistor rises, the loss caused by the current-limiting resistor is significantly increased. Thus, this method has a problem in that the overall loss of the pulse current application circuit is consequently increased.

SUMMARY OF THE INVENTION

According to one aspect, there is provided a pulse current application circuit including: a first switching element; an inductive load which is connected in series with the first switching element and is connected between a power supply and a reference potential; a second switching element which is connected in series with a current application target between a connection point of the first switching element and the inductive load and the reference potential; and a commutation circuit which is connected in parallel to the inductive load and through which a current does not flow when the second switching element is in a conductive state and through which a current flows when the second switching element is in a cut-off state.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
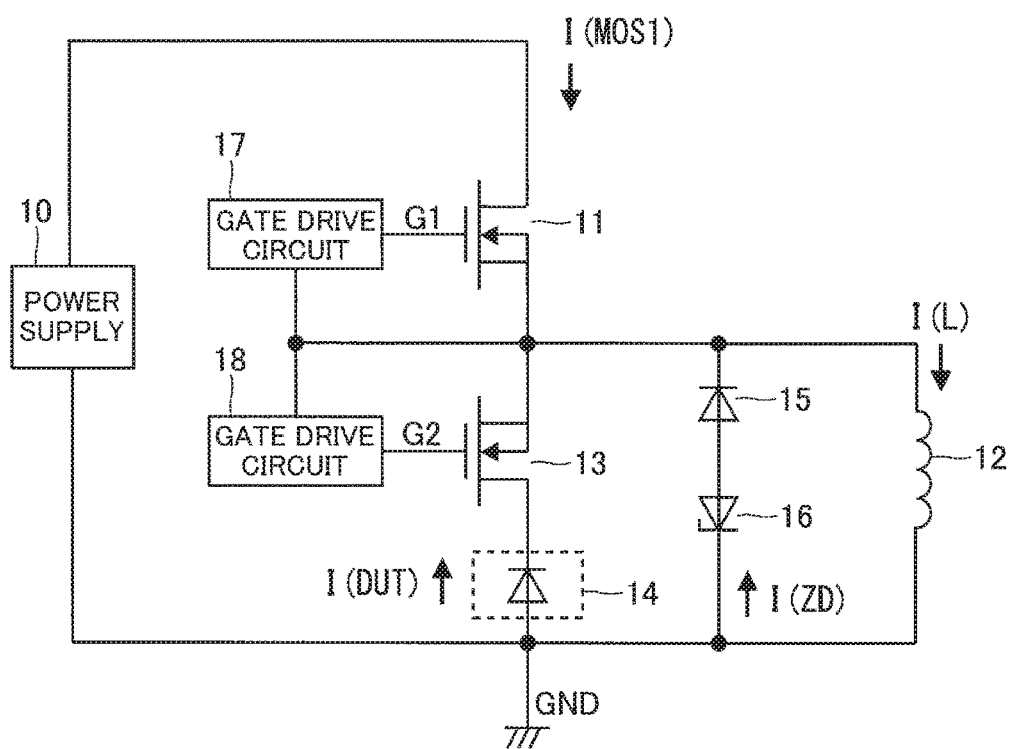
FIG. 1 is a circuit diagram illustrating an example of a pulse current application circuit according to a first embodiment.

Hereinafter, embodiments will be described in detail with reference to the accompanying drawings, wherein like reference characters refer to like elements throughout. An individual embodiment may be realized by partially combining a plurality of embodiments, as long as the combination does not cause contradiction.

Figure 2:
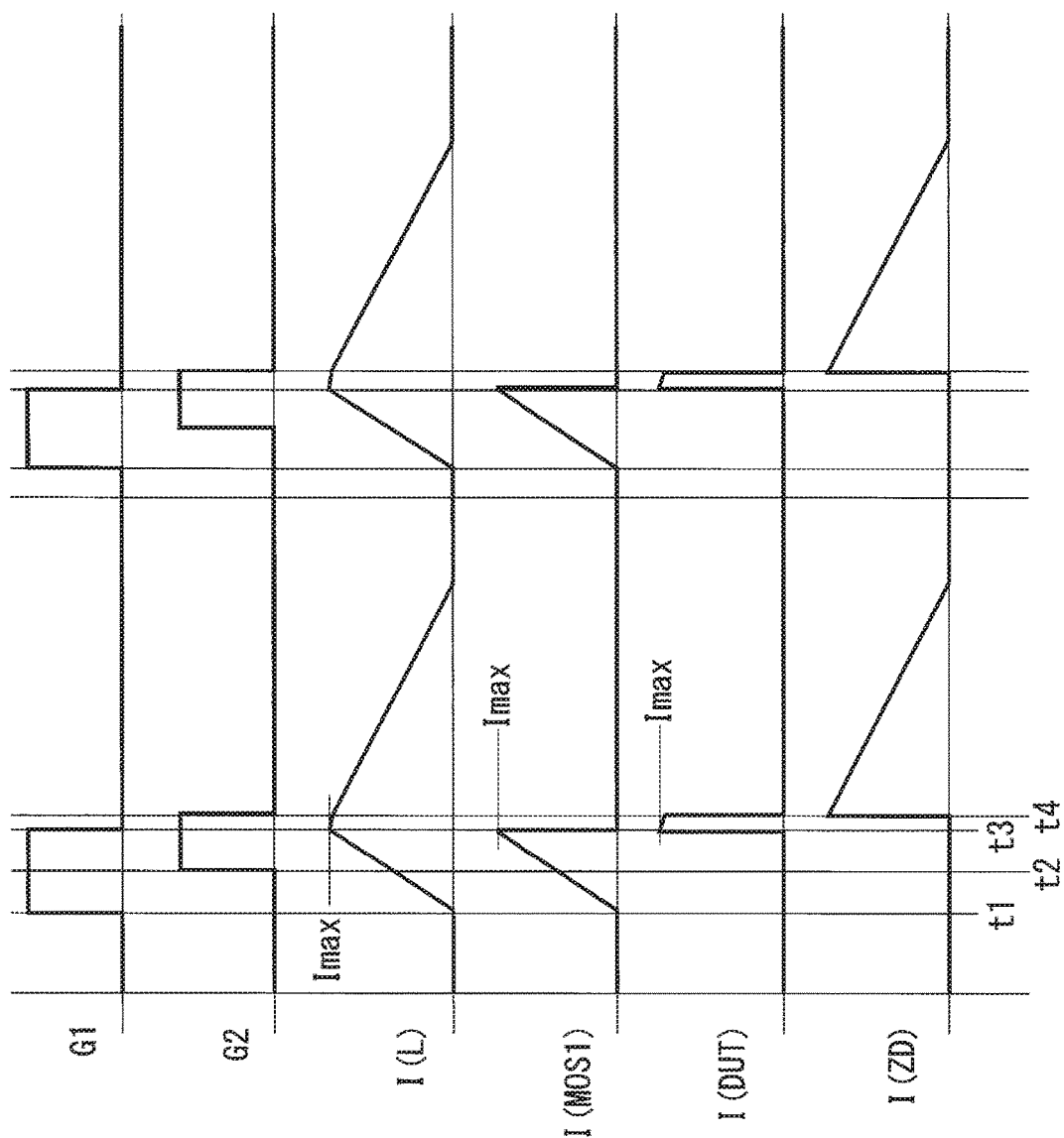
FIG. 2 is a timing diagram illustrating an operation of the pulse current application circuit according to the first embodiment.

FIG. 1 is a circuit diagram illustrating an example of a pulse current application circuit according to a first embodiment, and FIG. 2 is a timing diagram illustrating an operation of the pulse current application circuit according to the first embodiment.

As illustrated in FIG. 1, the pulse current application circuit according to the first embodiment includes a MOS transistor (a first switching element) 11 having a drain terminal connected to the positive terminal of a power supply 10. The negative terminal of the power supply 10 is connected to a reference potential (GND). The MOS transistor 11 has a source terminal connected to one terminal of an inductor (inductive load) 12, and the other terminal of the inductor 12 is connected to the reference potential (GND).

The source terminal of the MOS transistor 11 is connected to the source terminal of a MOS transistor (a second switching element) 13, and the drain terminal of the MOS transistor 13 is connected to one terminal of a DUT (a current application target) 14. The other terminal of the DUT 14 is connected to the reference potential (GND). For example, a PiN diode using SiC (Silicon Carbide) material or a body diode of a MOS transistor may be used as the DUT 14. Thus, the cathode terminal of the diode used as the DUT 14 is connected to the drain terminal of the MOS transistor 13, and the anode terminal of the diode used as the DUT 14 is connected to the reference potential (GND). In FIG. 1, the series circuit of the MOS transistor 13 and the DUT 14 forms a first commutation circuit that is connected in parallel to the inductor 12 and that applies a pulse current to the DUT 14 by commutating a current that has been flowing through the inductor 12.

The source terminal of the MOS transistor 11 is also connected to the cathode terminal of a diode 15, and the anode terminal of the diode 15 is connected to the anode terminal of a Zener diode 16. The cathode terminal of the Zener diode 16 is connected to the reference potential (GND). Thus, the diode 15 and the Zener diode 16 connected in anti-series form a second commutation circuit that is connected in parallel to the inductor 12 and that commutates and consumes the current that has been flowing through the inductor 12 and the first commutation circuit. This pulse current application circuit is configured to meet a condition that a total value of a built-in voltage of the diode 15 and a breakdown voltage of the Zener diode 16 is larger than a voltage drop that occurs across the first commutation circuit while a current is flowing through the first commutation circuit. Namely, a forward current does not flow through the second commutation circuit while a forward current is flowing through the first commutation circuit. In this embodiment, while a single diode 15 and a single Zener diode 16 are used, two or more diodes 15 and Zener diodes 16 may be used as long as the above condition is met.

The gate terminal of the MOS transistor 11 is connected to a gate drive circuit 17 and supplied with a gate voltage G1. The gate terminal of the MOS transistor 13 is connected to a gate drive circuit 18 and supplied with a gate voltage G2. Since the gate voltages G1 and G2 use the respective source terminals of the MOS transistors 11 and 13 as their reference potentials, an insulating circuit such as a digital isolator is used for signal transmission from an upper device to the gate drive circuits 17 and 18.

For example, power switching elements whose withstand voltage is 1,200 volts (V) and pulsed drain current is 100 A are used as the MOS transistors 11 and 13. For example, a coil of a few microhenries (μH) to a few dozen μH, e.g., 5 to 30 μH, is used as the inductor 12 that accumulates energy to apply a pulse current to the DUT 14. The voltage V (DC) of the power supply 10 is set from a few dozen V to a few hundred V. In addition, a power Zener diode having large power consumption is used as the Zener diode 16 of the second commutation circuit.

Next, an operation of the pulse current application circuit configured as described above will be described with reference to FIG. 2. First, as illustrated in FIG. 1, the DUT 14 is connected between the MOS transistor 13 and the reference potential (GND), to form the first commutation circuit.

When the gate drive circuit 17 applies a high-level (H) gate voltage G1 to the gate terminal of the MOS transistor 11 at time t1, the MOS transistor 11 is turned on, and a current I(L) starts to flow through the inductor 12. At the same time, the same current I (MOS1) flows through the MOS transistor 11. The current I(L) that flows through the inductor 12 increases with a slope expressed by the following expression (1).

$$di/dt=\{V(DC)-Von(MOS1)\}/L \quad (1)$$

In this expression (1), V(DC) represents the voltage of the power supply 10, Von(MOS1) represents the drain-source voltage when the MOS transistor 11 is turned on, and L represents the inductance of the inductor 12.

At this point, since the DUT 14 of the first commutation circuit is reverse-biased, no current flows through the DUT 14. In addition, since the diode 15 of the second commutation circuit is reverse-biased, no current flows through the diode 15. If there is no current-limiting capability in this state, for example, if the withstand voltage of the DUT 14 is less than the voltage V (DC) of the power supply 10, a diode needs to be connected in series with the DUT 14 so that a total value of the withstand voltages of the DUT 14 and the diode is equal to or more than the power supply voltage.

Next, at time t2 when the MOS transistor 11 is still on, the gate drive circuit 18 applies the gate voltage G2 to the gate terminal of the MOS transistor 13. While this application of the gate voltage G2 turns on the MOS transistor 13, since the DUT 14 is simply supplied with a reverse-bias voltage, no current flows through the DUT 14.

Next, when the MOS transistor 11 is turned off at time t3, the current supplied to the inductor 12 is stopped. Thus, the current I(L) flowing through the inductor 12 reaches its maximum current value Imax at time t3. Thereafter, the current I(L) that has been flowing through the inductor 12 still has the momentum to flow in the same direction. At time t3, since the MOS transistor 13 has already been turned on, the current I(L) that has been flowing through the inductor 12 is commutated to the first commutation circuit formed by the DUT 14 and the MOS transistor 13, and a current I(DUT) starts to flow through the DUT 14. The current I(L) changes as expressed by the following expression (2).

$$-di/dt=\{Von(MOS2)+Vf(DUT)\}/L \quad (2)$$

In this expression (2), Von(MOS2) represents a drain-source voltage when the MOS transistor 13 is turned on and Vf(DUT) is a forward voltage of the DUT 14. At time t3, since the voltage drop at the first commutation circuit is lower than a total voltage of the breakdown voltage of the Zener diode 16 and the built-in voltage of the diode 15, no current flows through the second commutation circuit.

Next, when the MOS transistor 13 is turned off at time t4, the current I(DUT) that has been flowing through the DUT 14 is cut off. In this way, a short pulse having a pulse width flows through the DUT 14 between time t3 and time t4.

When the MOS transistor 13 is turned off at time t4, since the current flowing through the first commutation circuit is cut off, the inductor 12 commutates the energy accumulated to maintain the current flow to the second commutation circuit. A current I(ZD) that flows through the Zener diode 16 reaches its maximum value at time t4 and decreases thereafter. The current I(L) flowing through the Zener diode 16 changes as expressed by the following expression (3).

$$-di/dt=\{V(ZD)+Vf(D2)\}/L \quad (3)$$

In this expression (3), V(ZD) represents the breakdown voltage and the operation voltage of the Zener diode 16, and Vf(D2) represents the forward voltage of the diode 15. As a result, all the remaining energy accumulated by the inductor 12 is consumed by the Zener diode 16 and the diode 15 of the second commutation circuit.

To apply a pulse current to the DUT 14 again, it is only needed to repeat the above sequence after the current flowing through the Zener diode 16 and the diode (the second commutation circuit) reaches zero, namely, in a so-called discontinuous mode. In this pulse current application circuit, the MOS transistor 13 is turned on while the MOS transistor 11 is on. However, the MOS transistor 13 may be turned on any time after the current flowing through the second commutation circuit reaches zero. In addition, as seen from expression (3), it is needless to say that raising the voltage V(ZD) applied to the Zener diode 16 is effective in shortening the time needed for the current to reach zero and increasing the repetition frequency.

As described above, first, the MOS transistor 11 accumulates energy in the inductor 12, and next, the MOS transistor 13 applies a short pulse current from the inductor 12 to the DUT 14. Next, the Zener diode 16 consumes the remaining energy of the inductor 12.

This pulse current application circuit generates a pulse current applied to the DUT 14 not by causing a single switching element to perform switching at high speed but by using timings at which two switching elements are turned off. Thus, the pulse current application circuit is able to generate a pulse current having a small pulse width. In this first embodiment, the pulse current application circuit is able to generate a square wave having a pulse width of 200 ns.

Figure 3:
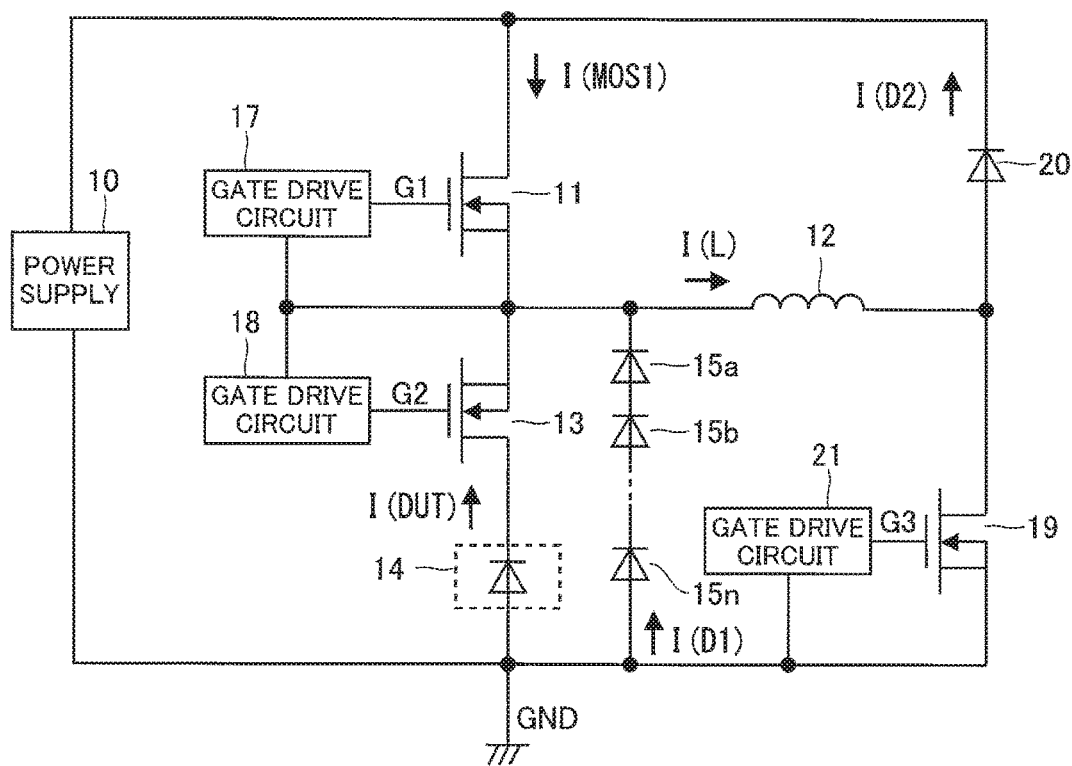
FIG. 3 is a circuit diagram illustrating an example of a pulse current application circuit according to a second embodiment.
Figure 4:
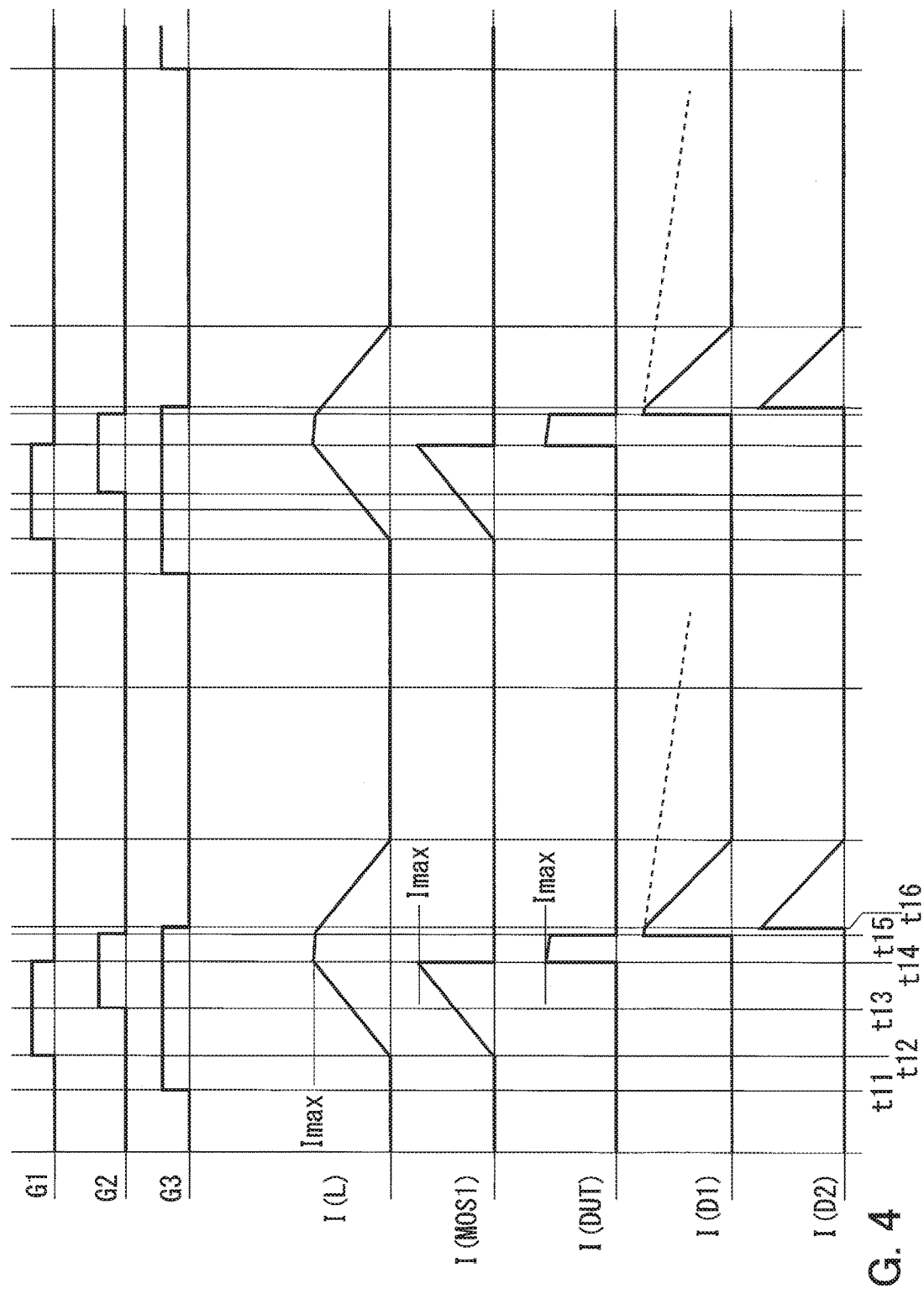
FIG. 4 is a timing diagram illustrating an operation of the pulse current application circuit according to the second embodiment.

FIG. 3 is a circuit diagram illustrating an example of a pulse current application circuit according to a second embodiment. FIG. 4 is a timing diagram illustrating an operation of the pulse current application circuit according to the second embodiment. In the circuit diagram in FIG. 3, constituent elements that are the same as or equivalent to those in the circuit in FIG. 1 will be denoted by like reference characters.

As illustrated in FIG. 3, the pulse current application circuit according to the second embodiment includes a MOS transistor 11 having a drain terminal connected to the positive terminal of a power supply 10. The negative terminal of the power supply 10 is connected to a reference potential (GND). The MOS transistor 11 has a source terminal connected to one terminal of an inductor 12, and the other terminal of the inductor 12 is connected to the drain terminal of a MOS transistor (a third switching element) 19 and the anode terminal of a diode (a regenerative diode) 20. The source terminal of the MOS transistor 19 is connected to the reference potential (GND), and the gate terminal of the MOS transistor 19 is connected to a gate drive circuit 21. A diode 20 has a cathode terminal connected to the positive terminal of the power supply 10 and forms a third commutation circuit. The diode 20 has a withstand voltage higher than the voltage of the power supply 10.

The source terminal of the MOS transistor 11 is also connected to the source terminal of a MOS transistor 13. The drain terminal of the MOS transistor 13 is connected to the cathode terminal of a DUT 14, and the anode terminal of the DUT 14 is connected to the reference potential (GND). The MOS transistor 13 and the DUT 14 form a first commutation circuit.

The source terminal of the MOS transistor 11 is also connected to the reference potential (GND) via a circuit formed by connecting n diodes 15a, 15b, . . . , and 15n in series. Namely, the source terminal of the MOS transistor 11 is connected to the cathode terminal of the diode 15a, and the anode terminal of the diode 15n is connected to the reference potential (GND). As with the second commutation circuit in the pulse current application circuit according to the first embodiment, the diodes 15a, 15b, . . . , and 15n have a function of limiting a current flow while the MOS transistor 13 is on.

Next, an operation of the pulse current application circuit configured as described above will be described with reference to FIG. 4. First, as illustrated in FIG. 3, the DUT 14 is connected between the MOS transistor 13 and the reference potential (GND).

When the gate drive circuit 21 applies a high-level (H) gate voltage G3 to the gate terminal of the MOS transistor 19 at time t11, the MOS transistor 19 is turned on. Consequently, the other terminal of the inductor 12 is connected to the reference potential (GND), and the series circuit of the MOS transistor 11 and the inductor 12 is connected between the positive terminal of the power supply 10 and the reference potential (GND).

Next, when a gate drive circuit 17 applies a high-level (H) gate voltage G1 to the gate terminal of the MOS transistor 11 at time t12, the MOS transistor 11 is turned on, and a current I(L) starts to flow through the MOS transistor 11 and the inductor 12 and increases with a slope expressed by the following expression (4).

$$di/dt=\{V(DC)-Von(MOS1)-Von(MOS3)\}/L \quad (4)$$

In this expression (4), Von(MOS3) represents a drain-source voltage when the MOS transistor 19 is turned on.

Next, at time t13 when the MOS transistor 11 is still on, a gate drive circuit 18 applies a gate voltage G2 to the gate terminal of the MOS transistor 13. Consequently, while the MOS transistor 13 is turned on, since reverse-bias voltage is applied to the DUT 14, no current flows through the DUT 14.

Next, when the MOS transistor 11 is turned off at time t14, the current that has been supplied to the inductor 12 is cut off. The inductor 12 commutates the energy accumulated to maintain the current flow to the first commutation circuit, and a current I(DUT) starts to flow through the DUT 14.

When this current I(DUT) starts to flow through the DUT 14 at time t14, the current I(DUT) reaches its maximum current value Imax. Thereafter, the current I(DUT) gradually decreases.

Next, when the MOS transistor 13 is turned off at time t15, the current I(DUT) that has been flowing through the DUT 14 is cut off. In this way, a short pulse having a pulse width flows through the DUT 14 between time t14 and time t15.

When the MOS transistor 13 is turned off, the current that has been flowing through the first commutation circuit starts to flow through the second commutation circuit. Namely, a current I(D1) flows through the diodes 15a, 15b, . . . , and 15n. At time t16 immediately after the MOS transistor 13 is turned off, the MOS transistor 19 is turned off. Consequently, since the closed-loop circuit formed by the inductor 12, the MOS transistor 19, and the diodes 15a, 15b, . . . , and 15n is cut off, the current that has been flowing through the inductor 12 is supplied to the power supply 10 for regeneration via the diode 20. As a result, a current I(D2) flows. After the MOS transistor 13 is turned off, almost all the energy that remains in the inductor 12 is consumed by the second commutation circuit unless the MOS transistor 19 is turned off. Namely, unless the MOS transistor 19 is turned off, the current I(D1) decreases slowly over time as indicated by a dashed line. Thus, by shortening the period between time t15 at which the MOS transistor 13 is turned off and time t16 at which the MOS transistor 19 is turned off as much as possible, the second commutation circuit consumes smaller energy. Instead, more energy is supplied to the power supply 10 for regeneration. Since most of the energy that does not contribute to the application of a pulse current is regenerated in the pulse current application circuit, a small-capacity power supply may be used as the power supply 10.

In the first embodiment, to expedite the attenuation of the current flowing through the inductor 12, the value of the voltage drop across the second commutation circuit needs to be increased. However, in the second embodiment, since the attenuation of the current flowing through the inductor 12 is determined mostly by the power supply voltage, the value of the voltage drop across the second commutation circuit does not need to be increased. More specifically, setting a total value of the built-in voltages of the diodes 15a, 15b, . . . , and 15n to a value that is not overly above a total value of the forward voltage Vf of the DUT 14 when a predetermined current flows and the drain-source voltage Von when the MOS transistor 13 is turned on is effective in reducing the loss at the diodes 15a, 15b, . . . , and 15n.

Figure 5:
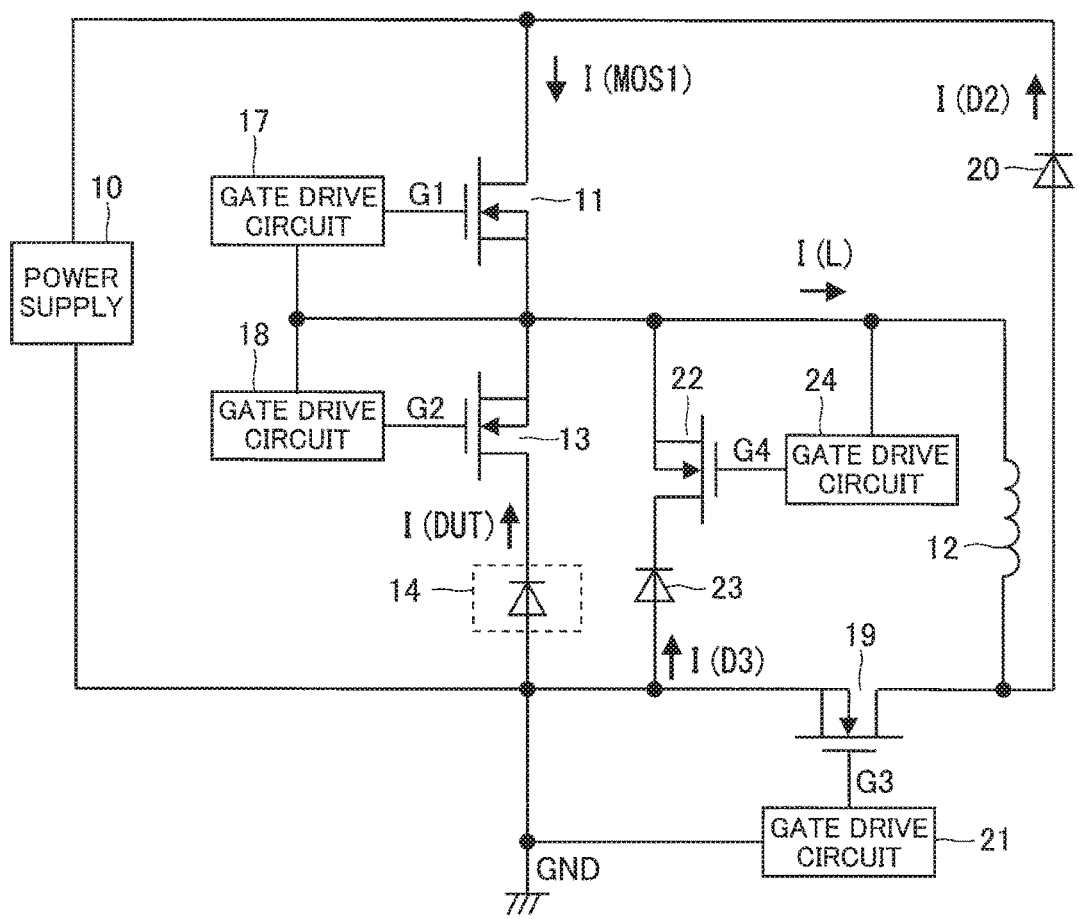
FIG. 5 is a circuit diagram illustrating an example of a pulse current application circuit according to a third embodiment.
Figure 6:
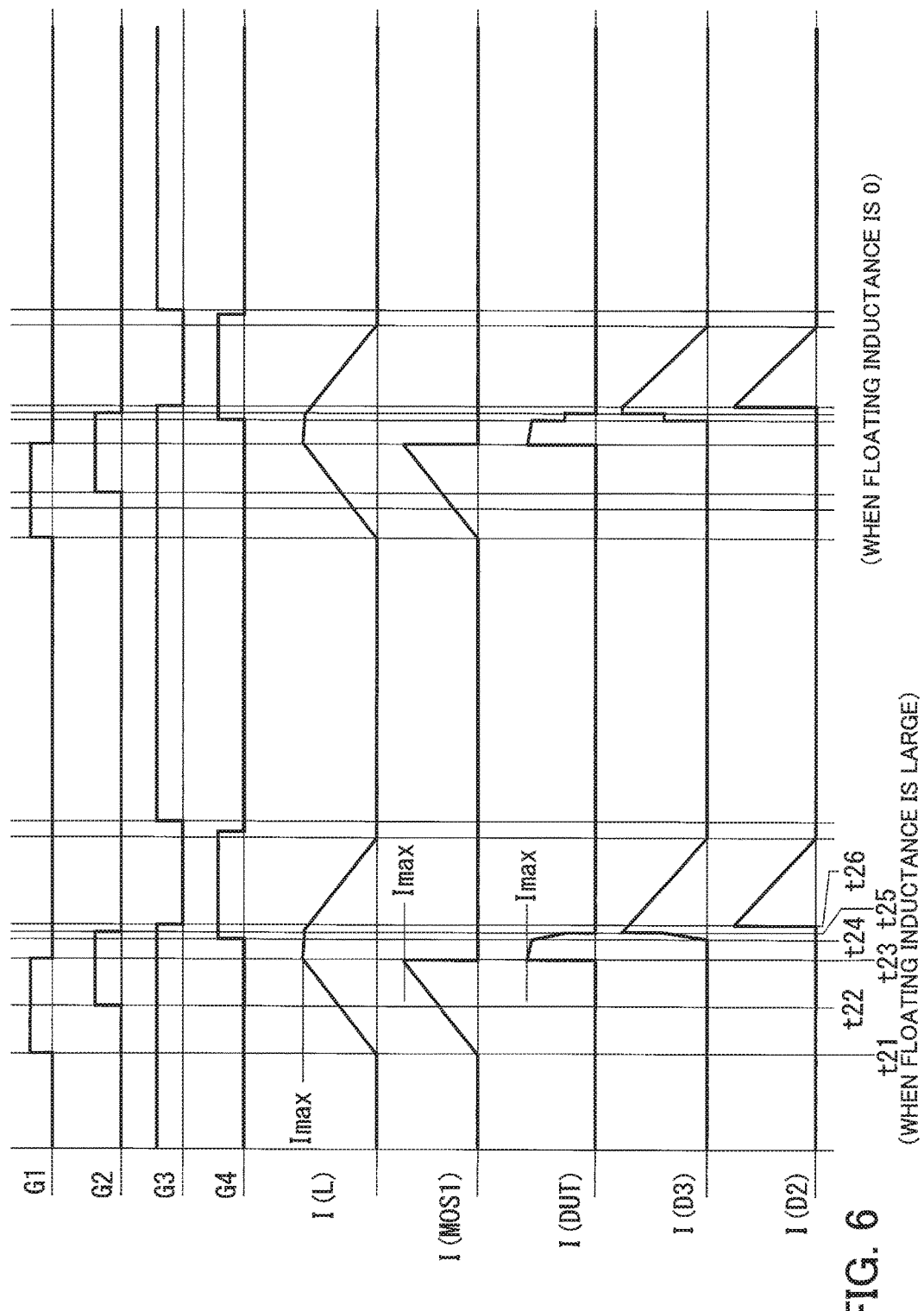
FIG. 6 is a timing diagram illustrating an operation of the pulse current application circuit according to the third embodiment.

FIG. 5 is a circuit diagram illustrating an example of a pulse current application circuit according to a third embodiment. FIG. 6 is a timing diagram illustrating an operation of the pulse current application circuit according to the third embodiment. In the circuit diagram in FIG. 5, constituent elements that are the same as or equivalent to those in the circuit in FIG. 1 will be denoted by like reference characters.

As illustrated in FIG. 5, the pulse current application circuit according to the third embodiment includes a MOS transistor 11 having a drain terminal connected to the positive terminal of a power supply 10. The negative terminal of the power supply 10 is connected to a reference potential (GND). The MOS transistor 11 has a source terminal connected to one terminal of an inductor 12, and the other terminal of the inductor 12 is connected to the drain terminal of a MOS transistor 19 and the anode terminal of a diode 20. The MOS transistor 19 has a source terminal connected to the reference potential (GND) and a gate terminal connected to a gate drive circuit 21. The cathode terminal of the diode 20 is connected to the positive terminal of the power supply 10. The diode 20 has a withstand voltage higher than the voltage of the power supply 10.

The source terminal of the MOS transistor 11 is also connected to the source terminal of a MOS transistor 13. The drain terminal of the MOS transistor 13 is connected to the cathode terminal of a DUT 14, and the anode terminal of the DUT 14 is connected to the reference potential (GND). The MOS transistor 13 and the DUT 14 form a first commutation circuit.

The source terminal of the MOS transistor 11 is also connected to the source terminal of a MOS transistor (a fourth switching element) 22, and the drain terminal of the MOS transistor 22 is connected to the cathode terminal of a diode 23. The anode terminal of the diode 23 is connected to the reference potential (GND). The MOS transistor 22 has a gate terminal connected to a gate drive circuit 24. The MOS transistor 22 and the diode 23 form a second commutation circuit.

Next, an operation of the pulse current application circuit configured as described above will be described with reference to FIG. 6. First, as illustrated in FIG. 5, the DUT 14 is connected between the MOS transistor 13 and the reference potential (GND).

First, after a current I(L) flowing through the inductor 12 in the previous pulse application reaches 0, when the gate drive circuit 21 applies a high-level (H) gate voltage G3 to the gate terminal of the MOS transistor 19, the MOS transistor 19 is turned on. Consequently, the other terminal of the inductor 12 is connected to the reference potential (GND).

When a gate drive circuit 17 applies a high-level (H) gate voltage G1 to the gate terminal of the MOS transistor 11 at time t21, the MOS transistor 11 is turned on. At this point, since the diode 23 of the second commutation circuit is reverse-biased, a current I(MOS1) or I(L) starts to flow through the inductor 12 from the power supply 10 via the MOS transistor 11. The current I(L) flowing through the inductor 12 increases as expressed by the above expression (4).

Next, at time t22 when the MOS transistor 11 is still on, a gate drive circuit 18 applies a high-level (H) gate voltage G2 to the gate terminal of the MOS transistor 13. Consequently, while the MOS transistor 13 is turned on, since a reverse-biased voltage is applied to the DUT 14, no current flows through the DUT 14.

Next, when the MOS transistor 11 is turned off at time t23, the current I(MOS1) supplied to the inductor 12 is cut off. The inductor 12 commutates the energy accumulated to maintain the current flow to the first commutation circuit. Consequently, a current I(DUT) starts to flow through the DUT 14. When this current I(DUT) starts to flow through the DUT 14 at time t23, the current I(DUT) reaches its maximum current value Imax. Thereafter, the current I(DUT) gradually decreases as expressed by the following expression (5).

$$-di/dt = \{V\text{on}(\text{MOS2}) + V\text{on}(\text{MOS3}) + Vf(\text{DUT})\}/L \quad (5)$$

Next, at time t24, the MOS transistor 22 receives a high-level (H) gate voltage G4 from the gate drive circuit 24 and is turned on. The MOS transistor 22 and the diode 23 form a second commutation circuit. If the total voltage of the drain-source voltage Von when the MOS transistor 22 is turned on and the forward voltage of the diode 23 is smaller than the voltage drop across the first commutation circuit, the current is shared by the first and second commutation circuits.

Next, when the MOS transistor 13 is turned off at time t25, all the current I(DUT) that has been flowing through the first commutation circuit is commutated to the second commutation circuit including the MOS transistor 22 and the diode 23, and a current I(D3) flows. In this way, a short pulse having a pulse width flows through the DUT 14 between time t23 and time t25.

Next, when the MOS transistor 19 is turned off at time t26, since the path from the second commutation circuit to the reference potential is cut off, the current that has been flowing through the inductor 12 is commutated to a third commutation circuit formed by the diode 20. Consequently the current is converted into a current I(D2) and is supplied to the power supply 10 for regeneration.

In this pulse current application circuit, since a total value of the forward voltage drop across the diode 23 of the second commutation circuit and the drain-source voltage Von when the MOS transistor 22 is turned on is small, the loss at the second commutation circuit is small. In addition, since the energy that remains in the inductor 12 is attenuated quickly by supplying the power after the application of a pulse current to the power supply 10 for regeneration, it is possible to increase the frequency of the repeated application of a current to the DUT 14 in a discontinuous mode.

Figure 7:
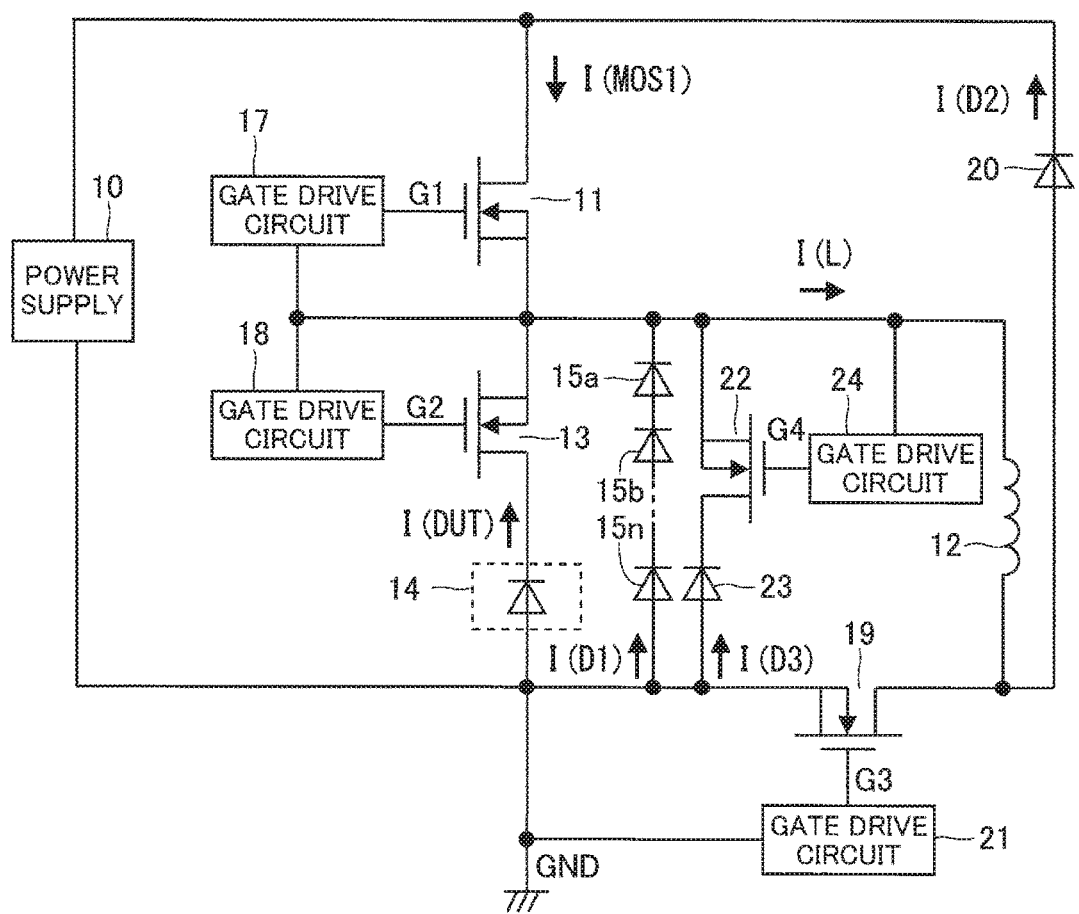
FIG. 7 is a circuit diagram illustrating an example of a pulse current application circuit according to a fourth embodiment.
Figure 8:
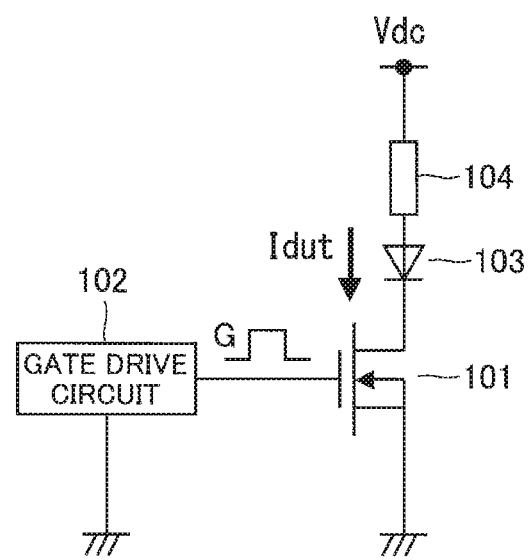
FIG. 8 is a circuit diagram illustrating an example of a conventional pulse current application circuit using a MOS transistor.
Figure 9:
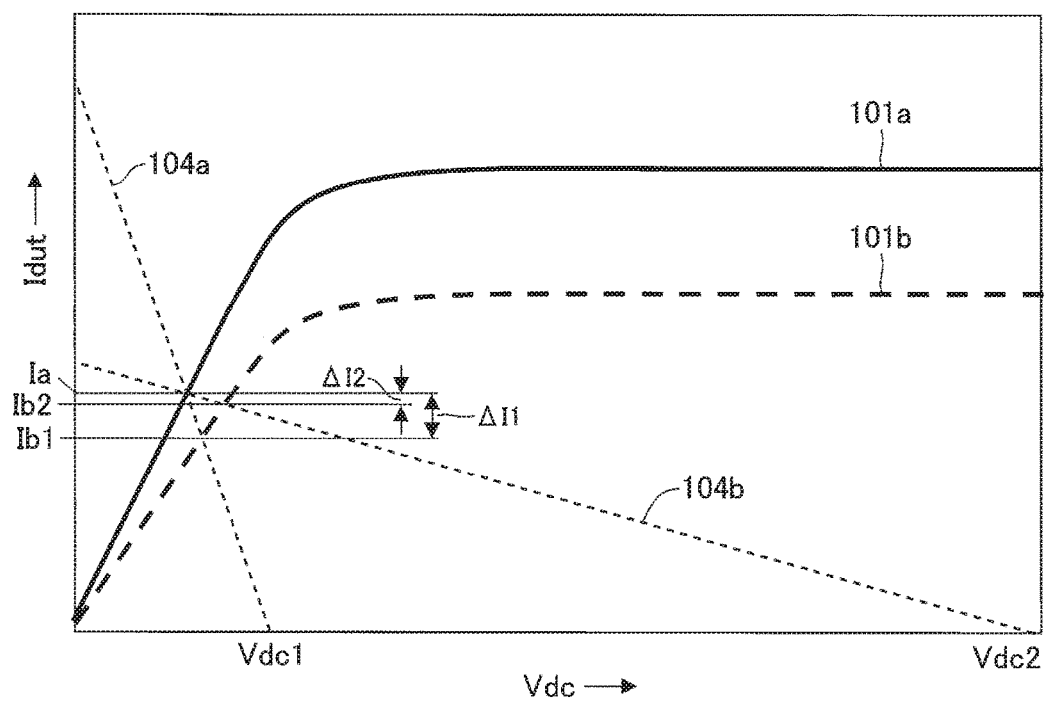
FIG. 9 illustrates load curves of operations of the conventional pulse current application circuit.

FIG. 7 is a circuit diagram illustrating an example of a pulse current application circuit according to a fourth embodiment. In the circuit diagram in FIG. 7, constituent elements that are the same as or equivalent to those in the circuit in FIG. 5 will be denoted by like reference characters.

In the pulse current application circuit according to the fourth embodiment, a circuit including n diodes 15a, 15b, . . . , and 15n connected in series is added to the second commutation circuit in the pulse current application circuit according to the third embodiment. In addition, a total value of the forward voltages of the diodes 15a, 15b, . . . , and 15n is larger than a total value of the on-voltage of a MOS transistor 13 and the forward voltage of a DUT 14.

As with the pulse current application circuit according to the third embodiment, this pulse current application circuit according to the fourth embodiment performs the turning-on of a MOS transistor 22 simultaneously with the turning-off of the MOS transistor 13. There are cases in which the turning-off of the MOS transistor 13 does not coincide with the turning-on of the MOS transistor 22. More specifically, there are cases in which the turning-on of the MOS transistor 22 lags the turning-off of the MOS transistor 13. If this happens, since the current I(L) that has been flowing through the inductor 12 is not smoothly commutated from the first commutation circuit to the second commutation circuit, for example, a voltage over the breakdown voltage of the MOS transistor 13 is applied to the MOS transistor 13. As a result, the MOS transistor 13 could be damaged.

However, if the turning-on of the MOS transistor 22 lags the turning-off of the MOS transistor 13, the current I(L) that has been flowing through the inductor 12 flows through the series circuit of the diodes 15a, 15b, . . . , and 15n. In this way, since an abnormally high voltage is not applied to the MOS transistor 13 of the first commutation circuit, the MOS transistor 13 will not be damaged.

With any one of the pulse current application circuits configured as described above and the control methods thereof, the first and second switching elements are sequentially brought into a cut-off state, and the pulse current applied to the current application target is generated from the inductive load in which energy is sufficiently accumulated in advance. Thus, a large current pulse having a narrow pulse width is outputted.

In addition, the current applied to the current application target is supplied from the inductive load, and the rate di/dt of the rise of the current is determined by the voltage applied to the inductive load. Thus, by setting the power supply voltage Vdc to a voltage sufficiently higher than the on-voltage of the first switching element and by finely controlling the on-period of the first switching element, the impact caused by the temperature characteristics of the first switching element is reduced. Namely, the embodiments have the advantage that the temperature characteristics fluctuate the value of the pulse current only slightly.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A pulse current application circuit for applying a pulse current to a current application target, comprising:
   a first switching element;
   an inductive load connected in series with the first switching element, the inductive load and the first switching element being connected between a power supply and a reference potential;
   a second switching element connected in series with the current application target, the second switching element and the current application target being connected between the reference potential and a connection point of the first switching element and the inductive load; and
   a commutation circuit connected in parallel to the inductive load, the commutation circuit having a current flowing therethrough and having no current flowing therethrough respectively when the second switching element is in a cut-off state and a conductive state, wherein
   the commutation circuit includes a diode and a Zener diode connected in anti-series, and
   when the second switching element is in the conductive state,
      the diode is forward-biased and the Zener diode is reverse-biased, and
      a total value of a built-in voltage of the diode and a breakdown voltage of the Zener diode is larger than a voltage drop across the second switching element and the current application target that occurs when a predetermined current flows through the second switching element and the current application target.

2. The pulse current application circuit according to claim 1, wherein
   the commutation circuit includes a plurality of diodes connected in series, and
   a total value of built-in voltages of the diodes connected in series is larger than a voltage drop across the second switching element and the current application target that occurs when a predetermined current flows through the second switching element and the current application target.

3. The pulse current application circuit according to claim 1, further comprising:
   a third switching element connected between the inductive load and the reference potential; and
   a regenerative diode connected between the power supply and a connection point of the inductive load and the third switching element.

4. The pulse current application circuit according to claim 1, further comprising:
   a third switching element connected between the inductive load and the reference potential; and
   a regenerative diode connected between the power supply and a connection point of the inductive load and the third switching element, wherein
   the commutation circuit includes
      a fourth switching element that is in a conductive state when the second switching element is in the cut-off state, and
      a first diode which is forward-biased when the fourth switching element is in the conductive state.

5. The pulse current application circuit according to claim 4, wherein
   the commutation circuit further includes a plurality of serially-connected second diodes that are connected in parallel to the fourth switching element and the first diode, and
   a total value of built-in voltages of the second diodes is larger than a voltage drop across the second switching element and the current application target that occurs when a predetermined current flows through the second switching element and the current application target.

6. A method for controlling application of a pulse current to a current application target via a pulse current application circuit, the pulse current application circuit including
   a first switching element and an inductive load connected in series between a power supply and a reference potential,
   a second switching element connected in series with the current application target, the second switching element and the current application target being connected between the reference potential and a connection point of the first switching element and the inductive load, and
   a commutation circuit connected in parallel to the inductive load,
the method comprising:
   bringing the first switching element into a conductive state, to thereby accumulate energy supplied from the power supply in the inductive load;
   bringing the second switching element into a conductive state, to thereby apply a current supplied to the inductive load to the current application target, which is in connection with the second switching element in a reverse-biased state;
   bringing the first switching element into a cut-off state, to thereby commutate current flowing through the inductive load to the current application target; and
   bringing the second switching element into a cut-off state after commutating the current flowing through the inductive load to the current application target for a predetermined period.

7. The method according to claim 6, further comprising, after bringing the second switching element into the cut-off state, commutating the current flowing through the current application target to the commutation circuit.

8. The method according to claim 7,
wherein the pulse current application circuit further includes a third switching element connected between the inductive load and the reference potential; and
wherein the method further comprises:
before the energy is accumulated in the inductive load, bringing the third switching element into a conductive state, and
after the current flowing through the current application target is commutated to the commutation circuit, bringing the third switching element into a cut-off state so that the current commutated to the commutation circuit is supplied to the power supply for regeneration.

* * * * *